(12) United States Patent
Noda et al.

(10) Patent No.: US 7,535,943 B2
(45) Date of Patent: May 19, 2009

(54) SURFACE-EMITTING LASER LIGHT SOURCE USING TWO-DIMENSIONAL PHOTONIC CRYSTAL

(75) Inventors: Susumu Noda, Kyoto (JP); Eiji Miyai, Kyoto (JP); Dai Onishi, Kyoto (JP)

(73) Assignees: Kyoto University, Kyoto (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/591,035

(22) PCT Filed: Mar. 4, 2005

(86) PCT No.: PCT/JP2005/003793

§ 371 (c)(1),
(2), (4) Date: Aug. 29, 2006

(87) PCT Pub. No.: WO2005/086302

PCT Pub. Date: Sep. 15, 2005

(65) Prior Publication Data

US 2007/0177647 A1 Aug. 2, 2007

(30) Foreign Application Priority Data

Mar. 5, 2004 (JP) .............................. 2004-063110

(51) Int. Cl.
*H01S 5/00* (2006.01)
(52) U.S. Cl. .................................. 372/45.01
(58) Field of Classification Search .................. None
See application file for complete search history.

(56) References Cited

U.S. PATENT DOCUMENTS

2003/0235229 A1* 12/2003 Deng et al. .................. 372/96

2005/0089075 A1* 4/2005 Baba et al. .................. 372/96

FOREIGN PATENT DOCUMENTS

| JP | A 2000-332351 | 11/2000 |
| JP | A 2003-273455 | 9/2003 |
| JP | A 2004-296538 | 10/2004 |

OTHER PUBLICATIONS

M. Imada et al., "Surface-emitting laser with two-dimensional photonic band structure embedded by water fusion technique," Summaries of Papers Presented et the Conference on Lasers and Electro-Optics 1999 (CLEO '99), pp. 455-456, May 23-28, 1999.

Y. Tanaka et al, "Theoretical investigation of a vertically asymmetric photonic crystal slab," The 5th Pacific Rim Conference onLasers and Electro-Optics 2003 (CLEO/Pacific Rim 2003) vol. 2, p. 402, Dec. 15-19, 2003.

* cited by examiner

*Primary Examiner*—Minsun Harvey
*Assistant Examiner*—Sean Hagan
(74) *Attorney, Agent, or Firm*—Oliff & Berridge, PLC

(57) ABSTRACT

Providing a surface-emitting laser light source capable of generating a linearly polarized laser light having a single-lobed beam profile that takes the largest intensity value in its central area. A two-dimensional photonic crystal consisting of a plate member with holes arranged in a square lattice pattern is provided on one side of an active layer. The holes are designed so that its plane shape on the emission side (plane "B") is smaller than that on the active layer side (plane "C"). The center of gravity of the shape on plane "B" is displaced from that of the shape on plane "C" in the in-plane direction. This design lowers the degree of the in-plane symmetry of the two-dimensional photonic crystal, so that a linearly polarized laser light having a single lobe is obtained.

6 Claims, 7 Drawing Sheets

(a)  (b)

Fig. 9
BAND EDGE A
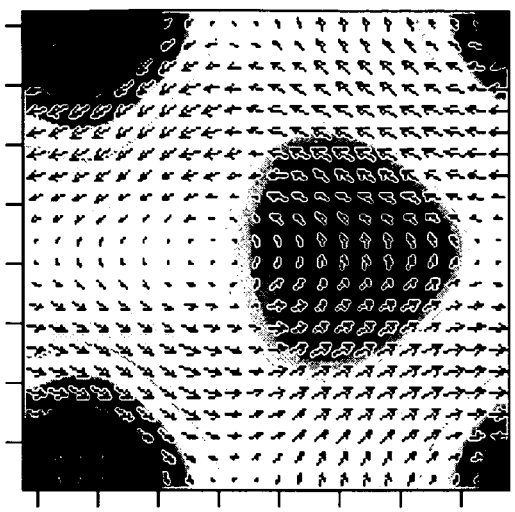
BAND EDGE B
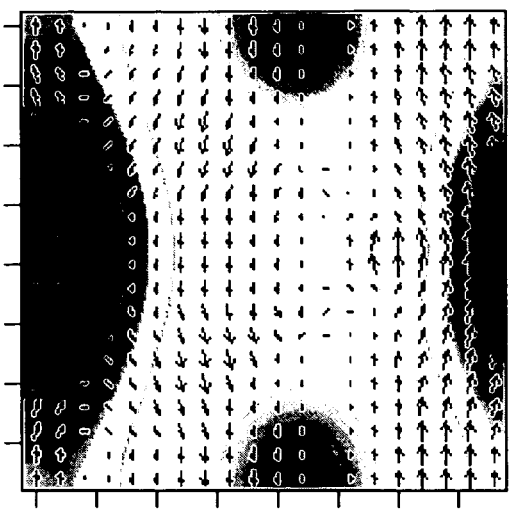
Fig. 10
Q-VALUE
|  | BAND A | BAND B |
|---|---|---|
| PRESENT EMBODIMENT (HOLE 312) | 5,851 | 1,055 |
| COMPARATIVE EXAMPLE (HOLE 412) | 34,525 | 9,511 |

(a) PRESENT EMBODIMENT
(HOLE 312), BAND A (b) PRESENT EMBODIMENT
(HOLE 312), BAND B (c) COMPARATIVE EXAMPLE
(HOLE 412), BAND A (d) COMPARATIVE EXAMPLE
(HOLE 412), BAND B

SURFACE-EMITTING LASER LIGHT SOURCE USING TWO-DIMENSIONAL PHOTONIC CRYSTAL

TECHNICAL FIELD

The present invention relates to a surface-emitting laser light source for emitting laser light in a direction perpendicular to the surface of a flat light source.

BACKGROUND ART

Conventional laser light sources include a Fabry-Perot laser light source, which uses a Fabry-Perot resonator, and a distributed feedback (DFB) laser light source, which uses a diffraction grating. These types of laser light sources produce an oscillation of laser light by amplifying light of a predetermined wavelength through resonation or diffraction.

In recent years, new types of laser light sources using a photonic crystal have been developed. A photonic crystal consists of a dielectric body material in which an artificial periodic structure is created. Usually, the periodic structure is created by providing the body material with a periodic arrangement of areas whose refractive index differs from that of the body material (this area is called the "modified refractive index area" hereinafter"). The periodic structure causes a Bragg diffraction within the crystal and creates an energy band gap with respect to the energy of light. There are two types of photonic crystal laser light sources, one of which utilizes a band-gap effect to use a point-like defect as a resonator, and the other utilizes a standing wave at a band edge where the group velocity of light becomes zero. Each of them causes an oscillation of laser light by amplifying light of a predetermined wavelength.

Patent Document 1 discloses a laser light source using a two-dimensional photonic crystal. This laser light source includes an active layer containing a light-emitting material inserted between a pair of electrodes and a two-dimensional photonic crystal located in the vicinity of the active layer. The two-dimensional photonic crystal consists of a plate member whose refractive index is periodically distributed over a two-dimensional area. The distance of a period of the periodic structure is adjusted so that it equals the wavelength of light generated in the active layer. In this construction, an injection of carriers from the electrodes generates light inside the active layer, and the light is intensified by the interference in the two-dimensional photonic crystal, and thus a laser oscillation occurs.

Patent Document 1 discloses a two-dimensional photonic crystal in which the refractive-index distribution is created within a semiconductor layer by cyclically arranging cylindrical holes in a lattice pattern (triangular, square, hexagonal and so on), where each hole is circle-shaped on the surface of the layer. In this structure, an emission of light from the active layer produces a two-dimensional standing wave within the two-dimensional photonic crystal. FIG. 1 schematically shows the two-dimensional photonic crystal and standing waves created within the crystal. FIG. 1 shows only one dimensional nature of the standing waves in a specific direction (called the "x-direction" hereinafter) within the crystal surface. If, for example, holes are arranged in a square lattice pattern, another standing wave occurs in the direction perpendicular to the x-direction. For the y-component of the electric field, the standing wave has two modes: the first mode has a node at the hole 12 of the two-dimensional photonic crystal 11, whereas the second mode has an antinode in the same location. For a given hole 12, if an axis ("z-axis") passing through its center is defined as the axis of symmetry, the first mode is anti-symmetric with respect to the z-axis, whereas the second mode is symmetric. From the viewpoint of the coupling to the external plane waves, the distribution function of the waves propagating in the z-direction takes a uniform value with respect to the x-direction. In contrast, with respect to the axis of symmetry, the distribution function is an odd function for the anti-symmetric mode or an even function for the symmetric mode.

Suppose that the two-dimensional photonic crystal has an infinite size. Then, if the mode is symmetric, a first-order diffracted light is emitted in the direction perpendicular to the surface because the overlap integral between the symmetric waves and the external plane waves is not zero. In the anti-symmetric mode, since the overlap integral between the generated waves and the external plane waves is zero, the emission of the first-order diffracted light in the direction perpendicular to the surface does not occur. Thus, the anti-symmetric mode, which has a stronger confining effect, is more suitable for laser oscillation. However, the anti-symmetric mode of light cannot be extracted in the direction perpendicular to the surface.

In practice, two-dimensional photonic crystals for surface-emitting laser light sources have a finite size. Therefore, even the anti-symmetric mode of light has its symmetry broken, so that the light can be extracted in the direction perpendicular to the surface. However, it is impossible to extract the light from the center of the two-dimensional photonic crystal in the direction perpendicular to the surface because the degree of symmetry is high at the center. As a result, the sectional shape of the laser beam (i.e. the beam profile) is like a ring in which the light is weaker at the center and stronger in the surrounding area. For coupling the beam to a single-mode optical fiber, it is desirable to have a single-lobed beam profile that takes the largest intensity value at its center, rather than the ring-shaped profile.

Patent Document 2 discloses a surface emission laser light source using a two-dimensional photonic crystal designed for improving the efficiency of extracting the laser light to the outside of the crystal, in which the holes are designed so that their sectional shape within a plane perpendicular to the crystal surface is tapered toward the principal light-emitting direction. This light source allows the laser light to be selectively extracted from one side of the two-dimensional photonic crystal and thereby intensified the extracted laser light as a whole. However, Patent Document 2 includes no discussion about the beam profile; it is impossible to obtain a single-lobed beam profile with the laser light source disclosed in Patent Document 2.

Patent Document 3 discloses a surface-emitting laser light source having a two-dimensional photonic crystal in which the lattice structure has translational symmetry but does not have rotational symmetry so that the symmetry within a plane parallel to the body of the crystal is broken. For example, this type of symmetric structure can be obtained by arranging holes in a square lattice pattern and shaping the holes into an equilateral triangle. In this laser light source, since the lattice structure of the two-dimensional photonic crystal has a low degree of symmetry, the emitted light of the anti-symmetric mode is not canceled out even in the central area of the two-dimensional photonic crystal, so that the beam profile is closer to the single-lobed shape.

In addition, the laser light source in Patent Document 3 produces a linearly polarized laser light because the lattice structure does not have rotational symmetry. Linearly polarized laser light is advantageous for coupling to optical fibers.

[Patent Document 1] Unexamined Japanese Patent Publication No. 2000-332351 (Paragraphs [0037] to [0056], FIG. 1)

[Patent Document 2] Unexamined Japanese Patent Publication No. 2003-273455 (Paragraphs [0016] to [0018], FIGS. 1 to 3)

[Patent Document 3] Unexamined Japanese Patent Publication No. 2004-296538 (Paragraphs [0026] to [0037], FIGS. 1 to 5)

DISCLOSURE OF THE INVENTION

Problem to be Solved by the Invention

One objective of the present invention is to provide a surface-emitting laser light source using a two-dimensional photonic crystal, which is capable of producing a linearly polarized laser light whose beam profile is close to a single-lobed shape.

Means for Solving the Problem

To solve the above problem, the present invention provides a surface-emitting laser light source using a two-dimensional photonic crystal, including:

a two-dimensional photonic crystal having a plate-shaped body material in which a large number of modified refractive index areas whose refractive index differs from that of the body material are periodically arranged; and an active layer provided on one side of the two-dimensional photonic crystal, which is characterized in that:

the plane shape of each modified refractive index area on the side opposite from the active layer is smaller than that on the other side facing the active layer; and the center of gravity of each modified refractive index area on the side facing the active layer is displaced from that on the side opposite from the active layer.

Modes for Carrying out the Invention and Their Effects

In the surface-emitting laser light source according to the present invention, the two-dimensional photonic crystal is provided on one side of the active layer. The two-dimensional photonic crystal does not need to be in direct contact with the active layer; it is possible to insert a spacer or other members between them. The active layer may be the same as those conventionally used in Fabry-Perot laser light sources. The surface-emitting laser light source according to the present invention utilizes the surface emission from the side of the two-dimensional photonic crystal facing the active layer as well as the surface emission from the other side opposite from the active layer. The following description assumes that the emission from the side opposite from the active layer is utilized. For the convenience of reference, the side opposite from the active layer is called the "emission side" hereinafter.

A two-dimensional photonic crystal is created from a plate-shaped body material by periodically arranging a large number of areas whose refractive index differs from that of the body material (i.e. the modified refractive index areas). In the present invention, the shape of the modified refractive index areas has two characteristics: (i) its plane shape, or the sectional shape on a plane parallel to the body material, on the emission side is smaller than that on the active layer side of the body material, and (ii) the center of gravity of the plane shape on the active layer side is displaced from that of the plane shape on the emission side in the in-plane direction.

In the two-dimensional photonic crystal used in the present invention, which is constructed as described above, the periodic structure of the modified refractive index areas within the two-dimensional photonic crystal has a lower degree of symmetry on the emission side than on the active layer side. In the surface-emitting laser light source according to the present invention, the x-component and the y-component of the electric field are the main components within the active layer. However, the z-component of the electric field within the two-dimensional photonic crystal (i.e. the component in the direction perpendicular to the two-dimensional photonic crystal) on the emission side is larger than that on the active layer side. Therefore, the time-averaged intensity of the electric field including the x-direction and the y-direction on the emission side is larger than that on the active layer side. Making the modified refractive index area less symmetric on the emission side than on the active layer side weakens the light-confining effect of the two-dimensional photonic crystal, so that the laser light is easier to be emitted to the outside.

Since the center of gravity of the plane shape of the modified refractive index area on the active layer side is displaced from that on the emission side in the in-plane direction, the above two-dimensional photonic crystal does not have rotational symmetry around an axis perpendicular to the body material. Thus, the crystal has a low degree of symmetry in the in-plane direction. In a laser light source using such a two-dimensional photonic crystal, the emitted light of the anti-symmetric mode is not canceled out even in the central area of the two-dimensional photonic crystal, so that the beam profile is closer to the single-lobed shape. The lack of rotational symmetry makes it possible to extract a linearly polarized laser light, as explained earlier.

There have been some conventional studies (e.g. Patent Document 3) that have proposed the technique of lowering the degree of symmetry in the in-plane direction of the modified refractive index area in order to extract a linearly polarized light whose beam profile is close to the single-lobed shape. The present invention has introduced the new technical idea of changing the shape also in the direction perpendicular to the plate-shaped body material to further lower the degree of symmetry in the in-plane direction. This design provides a higher degree of freedom to control the shape of the modified refractive index areas.

In an example of the modified refractive index area that has the aforementioned characteristics (i) and (ii), the plane shape on the surface of the active layer side is similar to that of the emission side, and the latter shape is smaller than the former so that their centers of gravity are displaced from each other. In another example, the plane shape on the emission side is created by cutting a portion of the plane shape on the active layer side.

In providing the difference in the plane shape of the modified refractive index area between the surface of the active layer side and that of the emission side, it is possible to design the shape (i.e. the plane shape inside the body material) between the two surfaces so that it changes along a linear or step-like profile. The step-like profile is easier to manufacture.

In addition to the above-described techniques of lowering the degree of in-plane symmetry, it is possible to appropriately choose the plane shape on the active layer side and/or the emission side to further lower the in-plane symmetry. For example, the plane shapes on the active layer side and the emission side may be an equilateral triangle or an ellipse. These shapes can create a clearer single lobe in the beam profile and improve the degree of linear polarization.

Examples of the periodic arrangement of the modified refractive index areas include a square lattice pattern, a triangular lattice pattern, and a hexagonal honeycomb pattern. The square lattice pattern is the most desirable one because it has the smallest number of energy bands that contributes to laser oscillation.

The modified refractive index area may preferably consist of holes, because this design provides a larger difference in refractive index from that of the body material and is easier to manufacture. However, if the two-dimensional photonic crystal needs to be fused with another layer at a high temperature during the manufacturing process, it is possible to create the modified refractive index areas by embedding certain members into the body material to prevent the modified refractive index areas from being deformed during the fusing process.

The operation of the surface-emitting laser light source using the two dimensional photonic crystal according to the present invention is basically the same as the operation of conventional ones: A voltage is applied to inject carriers into the active layer, whereby the light-emitting layer inside the active layer emits light. The light thus generated undergoes a feedback from the two-dimensional photonic crystal to build a standing wave within both the active layer and the photonic crystal layer, whereby a laser oscillation occurs. Since the aforementioned conditions are satisfied, a laser light is emitted from the emission surface to the direction perpendicular to the surface.

BRIEF DESCRIPTION OF THE DRAWINGS

FIG. 9 shows the electromagnetic field distribution within the two-dimensional photonic crystal using the hole shown in FIG. 3(a).

FIG. 10 is a table showing the Q-value of the two-dimensional photonic crystals using the holes shown in FIGS. 3(b) (present embodiment) and 6(b) (comparative example).

EXPLANATION OF NUMERALS

21 . . . Anode
22 . . . Cathode
23 . . . Active Layer
24 . . . Two-Dimensional Photonic Crystal Layer
25, 311, 312, 411, 412 . . . Hole
261, 262, 263 . . . Spacer Layer
271, 272 . . . Cladding Layer
28 . . . Contact Layer
321, 322, 422 . . . Step

EMBODIMENT

Figure 1:
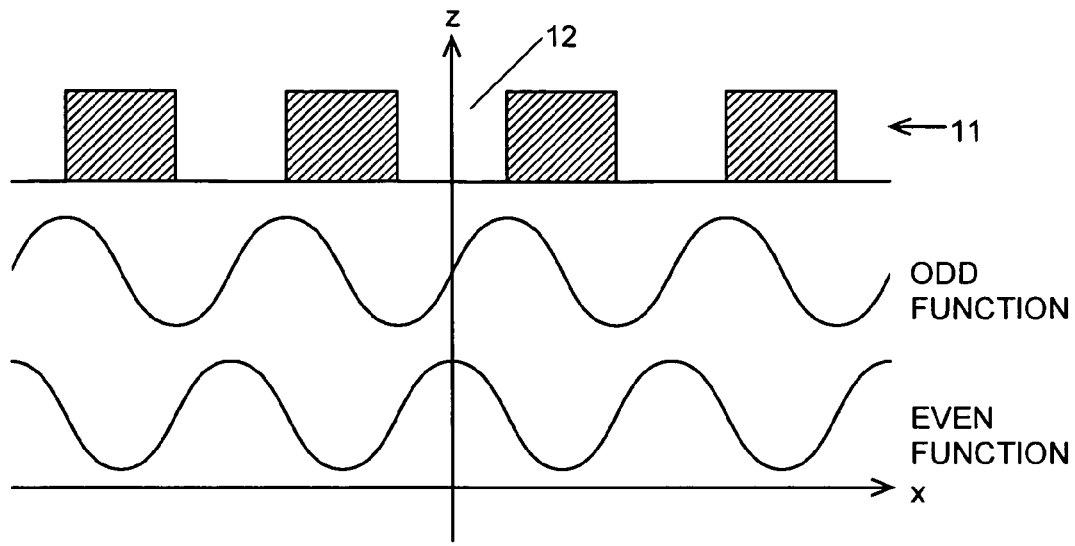
FIG. 1 is a graph showing the anti-symmetric mode and the symmetric mode of the standing wave inside the two-dimensional photonic crystal.
Figure 2:
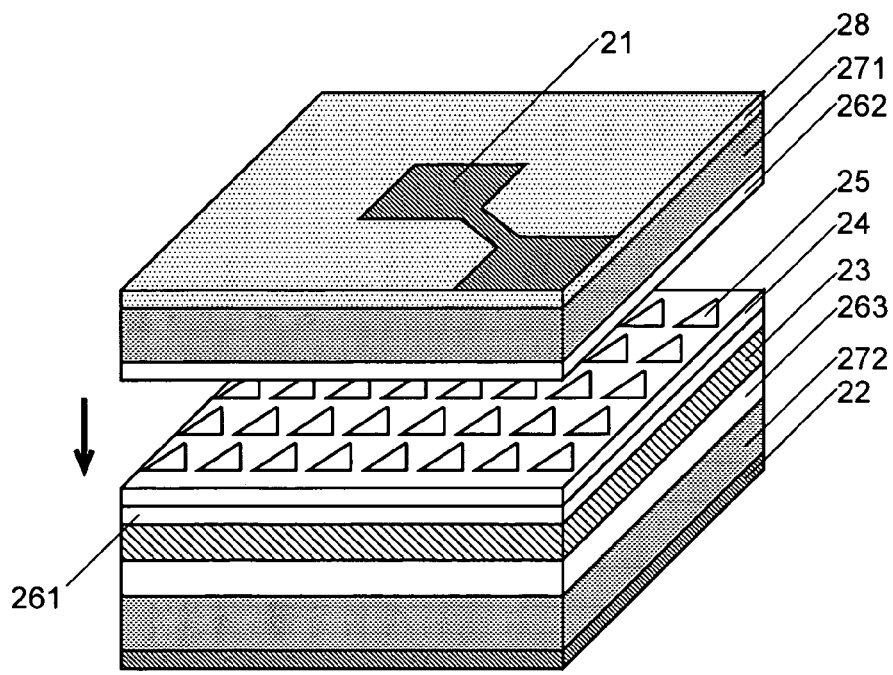
FIG. 2 is a perspective view of an embodiment of the surface-emitting laser light source using a two dimensional photonic crystal according to the present invention.

An embodiment of the surface-emitting laser light source using a two-dimensional photonic crystal according to the present invention is described with reference to FIG. 2. An active layer 23 made of Indium Gallium Arsenide (InGaAs)/Gallium Arsenide (GaAs) and having multiple-quantum wells (MQW) is provided between the anode 21 and the cathode 22. A two-dimensional photonic crystal layer 24 made of p-type GaAs is formed on the active layer 23 via a spacer layer 261, which is also made of p-type GaAs. The two-dimensional photonic crystal layer 24 consists of a plate member having holes 25 periodically arranged in a square lattice pattern. In the present embodiment, the spacer 261 and the two-dimensional photonic crystal layer 24 are integrally created as a single layer, in which the holes 25 are present only in the upper portion corresponding to the two-dimensional photonic crystal layer 24. A spacer layer 262 made of p-type GaAs, a cladding layer 271 made of p-type AlGaAs and a contact layer 28 made of p-type GaAs are provided between the active layer 23 and the anode 21. A spacer layer 263 made of n-type GaAs and a cladding layer 272 made of n-type AlGaAs are provided between the active layer 23 and the cathode 22. In FIG. 2, the spacer layer 262 is separated from the two-dimensional photonic crystal layer 24 in order to show the structure of the two-dimensional photonic crystal layer 24.

The operation of the laser light source in the present embodiment is basically the same as that of a conventional surface-emitting laser light source using a two-dimensional photonic crystal: When a voltage is applied between the anode 21 and the cathode 22, the anode 21 injects positive holes and the cathode 22 injects electrons into the active layer 23, respectively, and the positive holes recombine with the electrons to generate light. This light undergoes feedback from the two-dimensional photonic crystal layer 24, whereby a laser oscillation occurs. This laser light is extracted from the contact layer 28 (light-emitting surface) to the outside.

Two types of holes are used in the present embodiment as shown in FIGS. 3(a) and 3(b). In each of FIGS. 3(a) and 3(b), the upper drawing is the vertical sectional view at plane "A" perpendicular to the plate member 31 and the lower drawing shows the horizontal sections (or plan views) at planes "B" and "C", both parallel to the plate member 31. In FIG. 3(a), the plane shape of the hole 311 is an equilateral triangle on both the active layer side and the emission side. Due to the presence of the step 321 on the middle level, the plane shape on the emission side (plane "B") is smaller that on the active layer side (plane "C"). Since the two equilateral triangles share the same corner 34, their centers of gravity are displaced from each other in the direction perpendicular to their bases. As an example, FIG. 3(a) shows a construction in which the base of the equilateral triangle on the emission side is just above the center of gravity 331 of the equilateral triangle on the active layer side. In FIG. 3(b), the hole 312 is shaped like a circle on the active layer side (plane "C"), whereas the circle is partially cut along a chord on the emission side (plane "B").

In the surface-emitting laser light source using the two-dimensional photonic crystal 24 having the holes 311, even if the shape on plane "B" is the same as the shape on plane "C", the degree of in-plane rotational symmetry is low due to the equilateral triangular shape of the holes arranged in the square-lattice. Moreover, the difference between the shape on plane "B" and the shape on plane "C" further lowers the degree of in-plane rotational symmetry. Due to such a low degree of symmetry, the surface-emitting laser light source using the two-dimensional photonic crystal 24 having the holes 312 can produce a linearly polarized laser light whose beam profile is close to the single-lobed shape.

Figure 4:
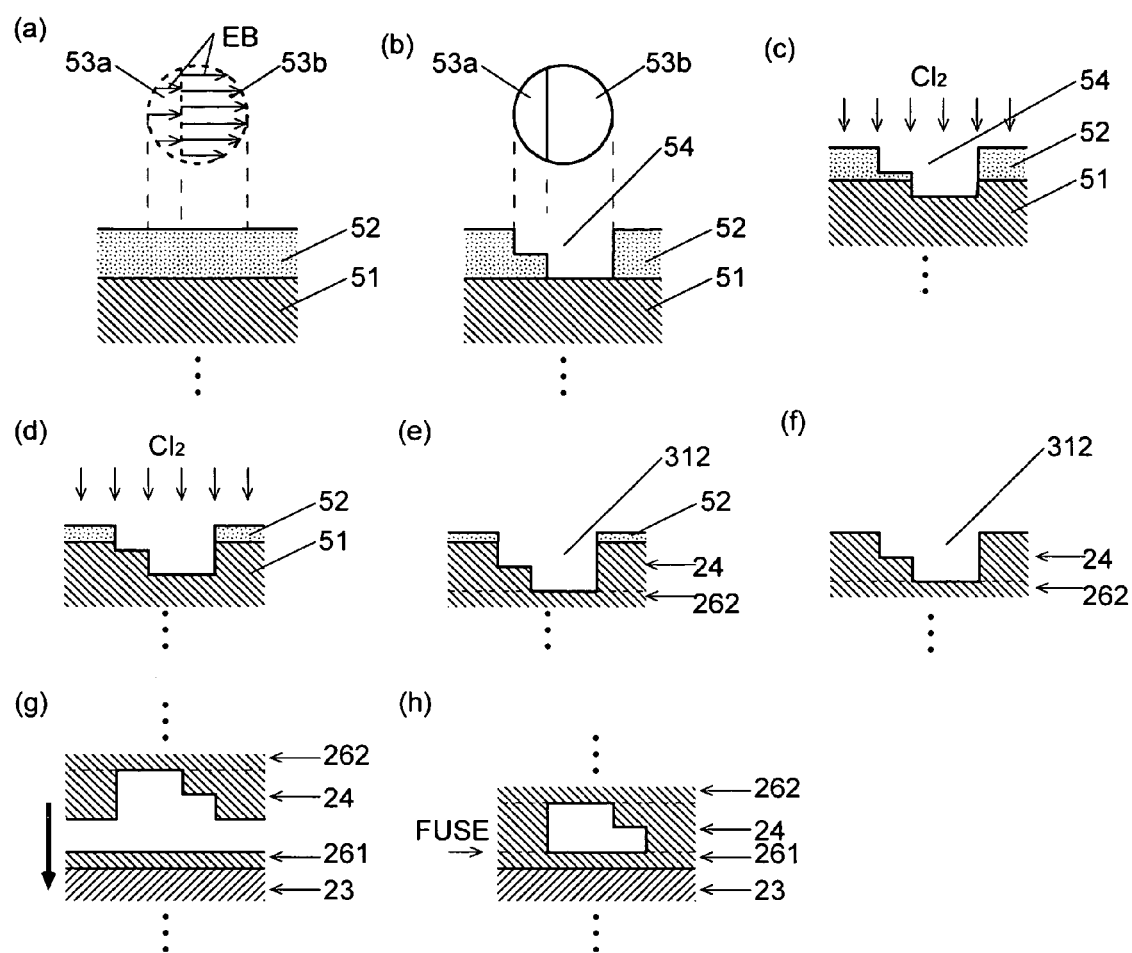
FIG. 4 shows plan views and sectional views illustrating an example of the process of manufacturing the surface-emitting laser light source using a two-dimensional photonic crystal in the present embodiment.

A process of manufacturing the surface-emitting laser light source using the two-dimensional photonic crystal in the present embodiment is described with reference to FIG. 4. It should be noted that the anode 21, cathode 22, active layer 23, spacer layer 263, cladding layers 271 and 272, and contact layer 28 can be manufactured by a conventional process. Accordingly, the following description focuses on the process of manufacturing the two-dimensional photonic crystal layer 24 clamped by the upper and lower spacers 261 and 262. The description assumes that the two-dimensional photonic crystal layer 24 having the holes 312 is to be created. It should be noted that the two-dimensional photonic crystal layer having the holes 311 or other types of holes can be also manufactured in a similar manner.

A resist 52 for electron-beam (EB) drawing is applied onto a substrate 51 made of p-type GaAs (FIG. 4(a), lower). Then, the position on the resist 52 at which the hole 312 is to be created is irradiated with the EB. The EB-irradiation time per unit area is controlled so that the area 53b in which the hole 312 penetrate from the active layer side to the emission side is irradiated for a longer time than the area 53a in which the hole 312 not be present on the emission side (FIG. 4(a), upper). As a result, a step-like hole 54 is created in the resist 52, where the hole reaches the surface of the substrate 51 within the area 53b while it stops at an intermediate level of the resist 52 within the area 53a. In practice, this hole 54 is created at a large number of points periodically arranged on the resist 52, though FIGS. 4(a)-4(h) show only one hole 54. Alternatively, the hole 54 may be created by a nano-printing process or a similar process. The nano-printing process is a technique in which a mold of a pattern having a size of a few nanometers is pressed onto a resist film to create a micro-pattern on the resist.

The next step is a dry-etching process using a chlorine gas. In the initial phase of the etching, the substrate 51 is etched only within the area 53b where its surface is exposed (FIG. 4(c)). Meanwhile, the chlorine gas also etches the resist 52, and later, the substrate 51 is exposed also within the area 53a (FIG. 4(d)). Now, the etching progresses within both areas 53a and 53b. The etching is discontinued after a predetermined period of time from the start. Since the etching time within the area 53b is longer than that within the area 53a, the resultant hole 312 has a step-like profile in which the hole is deeper within the area 53b (FIG. 4(e)). The portion of the substrate 51 lower than the bottom of the hole 312 within the area 53b becomes the spacer layer 262. Subsequently, the resist 52 is removed (FIG. 4(f)).

Next, the two-dimensional photonic crystal layer 24 is set on a spacer layer 261 made of p-type GaAs and formed on the active layer 23 by a normal process (FIG. 4(g)), and they are fused together by a heating process at temperatures between 200 and 700 degrees Celsius (FIG. 4(h)). Thus, the surface-emitting laser light source using the two-dimensional photonic crystal according to the present invention is completed.

The following description explains the result of calculation of a Q-value of the two-dimensional photonic crystal used in the surface-emitting laser light source using the two-dimensional photonic crystal having the holes 311 and 312 with reference to a comparative example.

Figure 5:
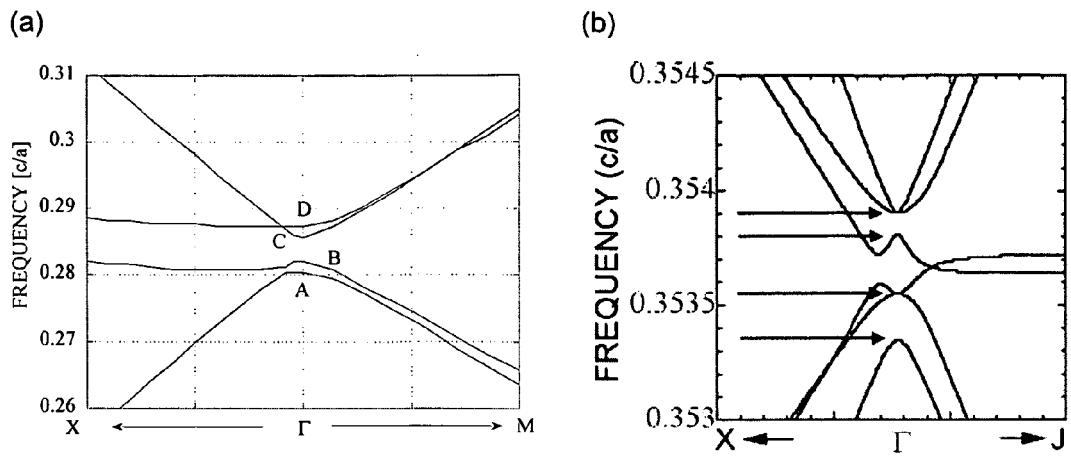
FIG. 5 shows graphs showing an example of the photonic band gap within the two-dimensional photonic crystal.

First, the photonic band of the two-dimensional photonic crystal used in the following calculation is described. FIG. 5(a) is a photonic band diagram corresponding to the case where the holes are arranged in a square lattice pattern, as in the present embodiment. For comparison, FIG. 5(b) shows a photonic band diagram corresponding to the case where the holes are arranged in a triangular lattice pattern. The calculation of FIG. 5(a) assumed that the hole shape is elliptic. The result is basically similar even if the hole has a different shape.

In FIG. 5(b), there are six bands in the vicinity of k=0 (Γ point), whereas the number of bands in FIG. 5(a) is four. Among these four bands, the band edges "A" and "B" of the two bands located on the lower-energy side (or the lower-frequency side) contribute to the laser oscillation. In a practical device having a finitely periodic structure, the Q-value of the band edge "B", whose dispersion relation is flat in the vicinity of the Γ point, tends to significantly decrease. Therefore, the laser oscillation tends to occur at the band edge "A" having a large gradient in the vicinity of the Γ point. Therefore, to stabilize the laser operation, it is desirable to design the crystal so that the Q-value at the band edge "A" is higher than that at the band edge "B" in an infinitely periodic system.

Figure 6:
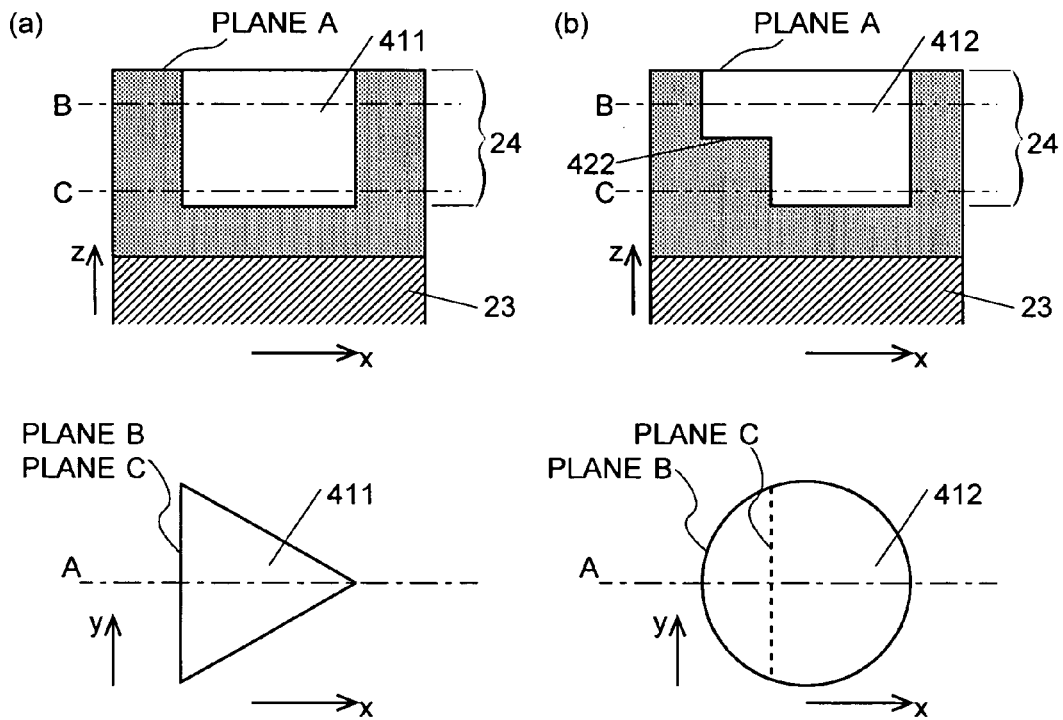
FIG. 6 shows sectional views of the shapes of holes formed in the two-dimensional photonic crystals in a comparative example.
Figure 7:
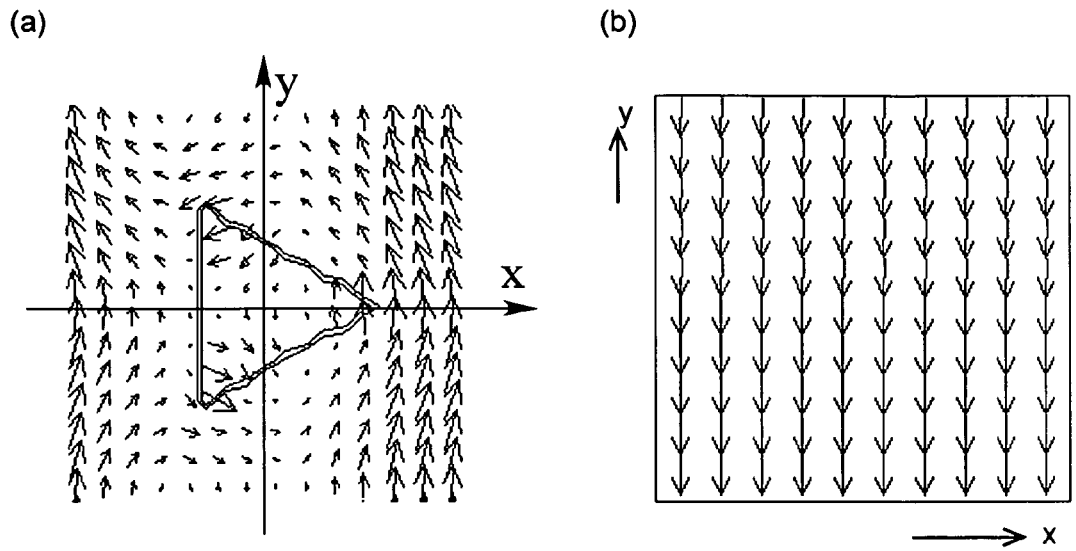
FIG. 7 shows the electric field distribution within the two-dimensional photonic crystal and that within a plane separated from the crystal surface in the comparative example shown in FIG. 6(a).

For comparison with the hole 311 having different sizes and displaced centers of gravity between the top and bottom surfaces, the same calculation was performed for another triangular hole 411 whose shape is the same on both the top and bottom surfaces (FIG. 6(a)). A surface-emitting laser light source using the two-dimensional photonic crystal shown in FIG. 6(a) is disclosed in Patent Document 3, which aimed to produce a linearly polarized laser light having a single lobe, similar to the present embodiment. In this case, the electric field distribution within the two-dimensional photonic crystal at the band edge "A" becomes as shown in FIG. 7(a). In this diagram, the length and direction of each arrow represent the intensity and direction of the electric field. The x-directional component Ex of the electric field is anti-symmetric with respect to the x-axis, whereas the y-directional component Ey of the electric is asymmetric with respect to the y-axis. This is because the plane shape of the hole is asymmetric with respect to the y-axis. Thus, by breaking only the anti-symmetry of Ey while maintaining the anti-symmetry of Ex, it is possible to extract a linearly polarized light from the surface while maintaining the two-dimensional coherence of the light within the surface. FIG. 7(b) shows the electric field on a plane separated from the crystal surface by a distance of 7a, where a is the distance of a period of the square lattice, i.e. the lattice constant of the photonic crystal. It shows that the light is strongly polarized in the y-direction.

Figure 8:
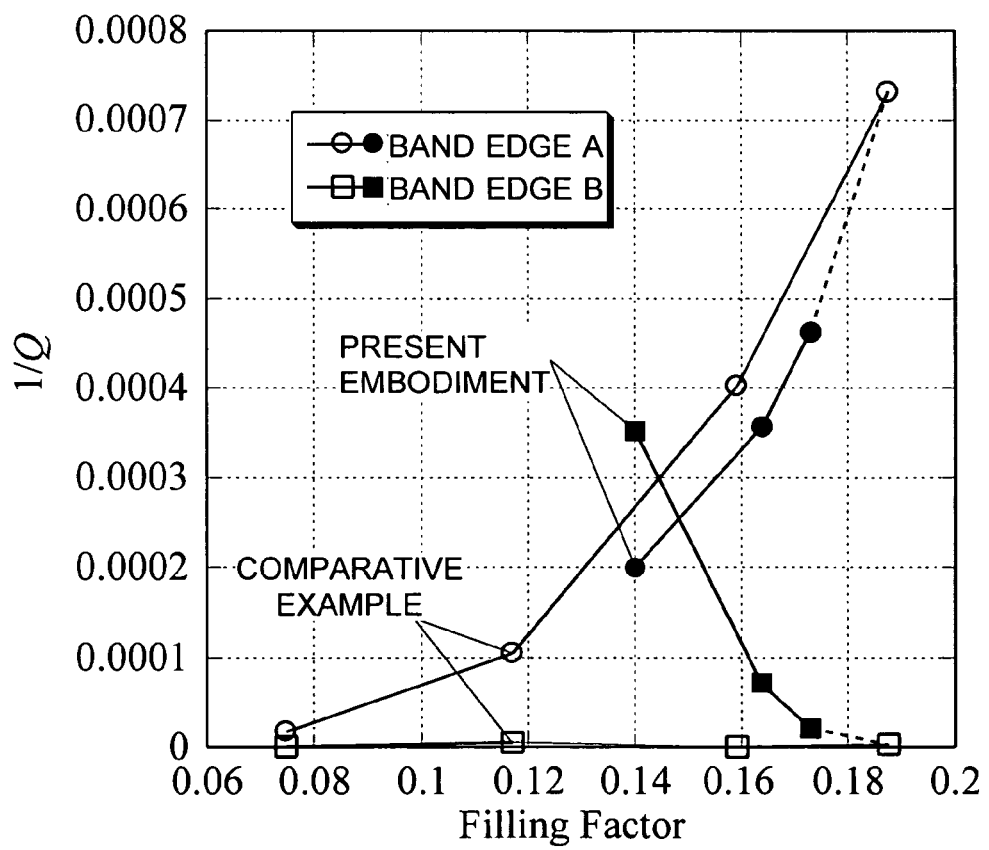
FIG. 8 is a graph showing the Q-value of the two-dimensional photonic crystals using the holes in FIGS. 3(a) (present embodiment) and 6(a) (comparative example).

Thus, light can be extracted by breaking the symmetry of the hole shape (the symmetry of mirror reflection was broken in the above case). This fact suggests that the Q-value can be controlled through the structure. In fact, the Q-value is infinite if an infinite number of holes whose plane shapes are circular are periodically arranged, whereas the Q-value takes a finite value if the hole has a triangular shape. Accordingly, on the assumption that an infinite number of the holes 411 of the comparative example are arranged in a square lattice pattern, the Q-value has been calculated by a three-dimensional FDTD (Finite Difference Time Domain) method. The result is shown in FIG. 8, where the white circles indicate the values at the band edge "A" and white squares indicate the values at the band edge "B." The filling factor (FF) is the volume fraction, which equals the area of the hole divided by the area of the unit cell in the present comparative example. At the band edge "A", the electric field is distributed around the hole, as shown in FIG. 7(a). Therefore, as the hole is larger, the structure change has a stronger effect. In contrast, through the electric field distribution is not shown in the drawing, the electric field in the mode of band edge "B" is distributed away from the hole, so that the Q-value is maintained at high levels from 100,000 to 2,000,000. Therefore, it is probable that the mode of band edge "B" is chosen for laser oscillation instead of the mode of band edge "A", which is actually suitable for laser oscillation. Moreover, the high level of Q-value prevents laser light from being extracted from the surface. In practice, the light can be extracted from the surface because the two-dimensional photonic crystal has a finite size. However, the light thereby obtained will be a ring-shaped beam whose intensity is low at its center.

Figure 3:
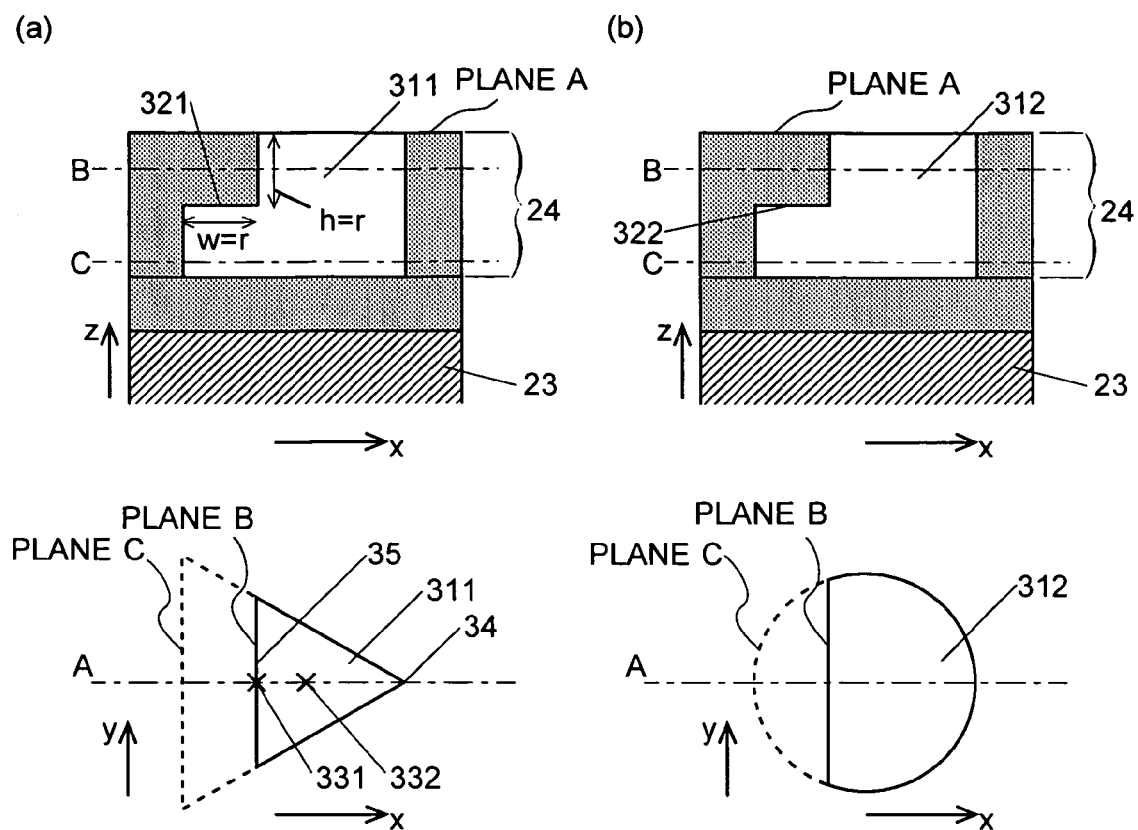
FIG. 3 shows sectional views of the shapes of holes formed in the two-dimensional photonic crystals in the present embodiment.

Now, the following description deals with the present embodiment using the hole 311 shown in FIG. 3($a$), in which the symmetry is broken in a different manner from the above-described comparative example. The result of calculating the Q-value is indicated by the black circles (for the band edge "A") and the black squares (for the band edge "B") in FIG. 8. It was assumed that, as shown in FIG. 3($a$), both the height h of the step 321 on the emission side and the X-directional width w of the step 321 were equal to r in the hole 311, and the calculation was performed for r=0.1a, 0.13a and 0.19a, respectively. Under these conditions, the FF value (volume of hole divided by volume of unit cell) was 0.173 (when r=0.1a), 0.164 (when r=0.13a) or 0.140 (when r=0.19a). When FF=0.140, Q=5,007.7 at the band edge "A" and Q=2,855.5 at the band edge "B." Therefore, the laser oscillation occurs at the band edge "A", whose Q-value is larger than that of the band edge "B." Since the Q-value of the band edge "A" is as low as several thousands, the resulting beam will be a single-lobed beam whose intensity is high at its center.

FIG. 9 shows the electromagnetic field distribution within the two-dimensional photonic crystal having the hole 311. In FIG. 9, the length and direction of each arrow represent the intensity and direction of the electric field, respectively, and the intensity of the magnetic field is indicated by the color thickness. The hole is at the center of each drawing. At the band edge "A", the electric field is intensified in the vicinity of the hole. This fact suggests that an asymmetric design of the in-plane shape will have a significant effect. Therefore, it is possible to lower the Q-value even without providing a difference in the plane shape between the upper and lower surfaces, as in the present embodiment. In contrast, at the band edge "B", the electric field is present away from the hole. Therefore, in addition to the in-plane asymmetry, it is necessary to provide a difference in the plane shape between the upper and lower surfaces in order to lower the Q-value.

The following description shows the result of a calculation for a laser light source having the hole 312 shown in FIG. 3($b$). For comparison, the same calculation was performed for a laser light source having the hole 412 shown in FIG. 6($b$). The hole 412 is shaped circular above the step 422, but the portion below the step 422 is shaped like a partially cut circle. In the holes 312 and 412, the hole shape on the emission side and that on the active layer side are replaced with each other.

FIG. 10 shows the Q-values calculated. The Q-values in the present embodiment is smaller than in the comparative example. In the comparative example, the Q=value at the band edge "A" is a high value of 34,525. Therefore, the resonance selectively occurs for the band edge "A", and the high Q-value impedes the extraction of light to the outside. In contrast, the Q-value in the present embodiment is as low as several thousands at both the band edges "A" and "B." Therefore, it is possible to produce a laser oscillation and extract the laser light to the outside.

In the hole 412, the asymmetry of the plane shape is present on the active layer side from the step 422, whereas, in the hole 312, it is on the emission side from the step 322. This fact suggests that it is possible to facilitate the extraction of light from the emission side by setting the degree of asymmetry of the plane shape higher as the position is closer to the emission side.

Figure 11:
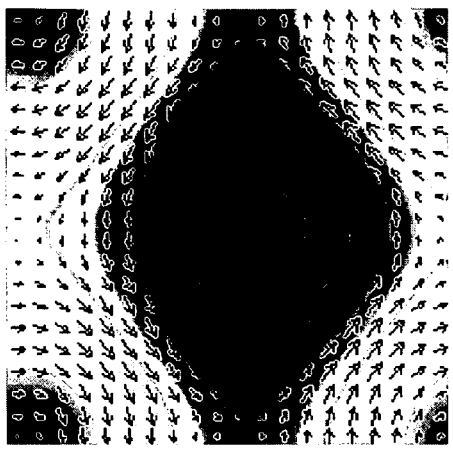
FIG. 11 shows the electromagnetic field distribution within the two-dimensional photonic crystals using the holes shown in FIGS. 3(b) (present embodiment) and 6(b) (comparative example).
Figure 11:
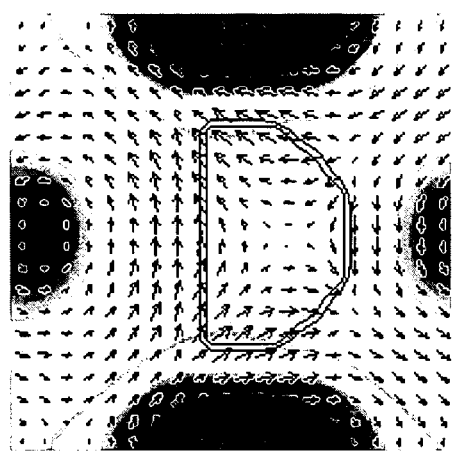
Figure 11:
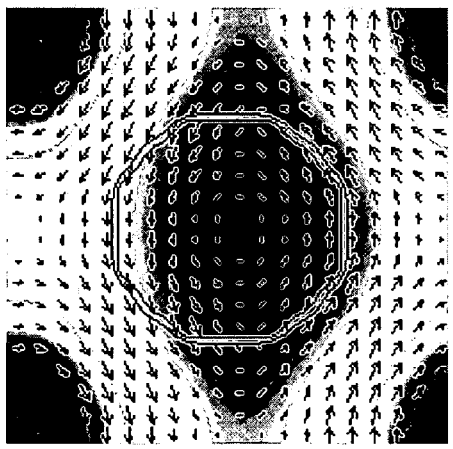
Figure 11:
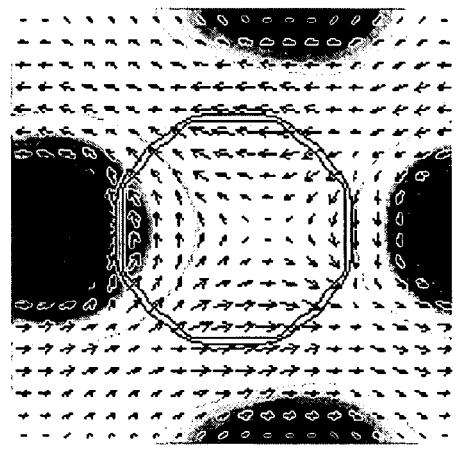

FIGS. 11($a$)-11($d$) show the electromagnetic field distribution within the two-dimensional photonic crystals in the present embodiment (hole 312) and the comparative example (hole 412). The displacement of the nodes of the electric field from the centers of the unit cells in the present embodiment is larger than that in the comparative example, and it is also larger at the band edge "B" than at the band edge "A." This result proves that the symmetry of the electric field is lower as the Q-value is smaller.

As described thus far, the present invention provides a higher degree of freedom to control the shape of the modified refractive index areas (e.g. holes) than the conventional surface-emitting laser light source using a two-dimensional photonic crystal designed to produce a linearly polarized light having a single lobe. Particularly, use of the holes 311 and 312 having the above-described shapes makes it possible to generate a strong beam of linearly polarized laser light having a single lobe.

The invention claimed is:

1. A surface-emitting laser light source using a two-dimensional photonic crystal, which includes:
   a two-dimensional photonic crystal having a plate-shaped body material in which a large number of modified refractive index areas whose refractive index differs from that of the body material are periodically arranged; and
   an active layer provided on one side of the two-dimensional photonic crystal,
   wherein a plane shape of each modified refractive index area on a side opposite from the active layer is smaller than that on another side facing the active layer; and
   wherein a center of gravity of each modified refractive index area on the side facing the active layer is displaced from that on the side opposite from the active layer.

2. The surface-emitting laser light source using a two-dimensional photonic crystal according to claim 1, wherein a cross-sectional shape of the modified refractive index area on a plane perpendicular to the body material has a step-like profile.

3. The surface-emitting laser light source using a two-dimensional photonic crystal according to claim 1, wherein the shape of the modified refractive index area on the side facing the active layer is a triangle, and the shape of the modified refractive index area on the side opposite from the active layer is a triangle that is smaller than the aforementioned triangle.

4. The surface-emitting laser light source using a two-dimensional photonic crystal according to claim 1, wherein the shape of the modified refractive index area on the side facing the active layer is a circle, and the shape of the modified refractive index area on the side opposite from the active layer is a shape obtained by partially cutting the aforementioned circle.

5. The surface-emitting laser light source using a two-dimensional photonic crystal according to claim 1, wherein the modified refractive index areas are arranged in a square lattice pattern.

6. The surface-emitting laser light source using a two-dimensional photonic crystal according to claim 1, wherein the modified refractive index area consists of holes or a member made of a material whose refractive index differs from that of the body material.

* * * * *